United States Patent [19]

Mitarai et al.

[11] 3,815,222

[45] June 11, 1974

[54] SEMICONDUCTOR STRUCTURE AND METHOD FOR LOWERING THE COLLECTOR RESISTANCE

[75] Inventors: Hajime Mitarai, Sunnyvale, Calif.; Carroll E. Nelson, Dallas, Tex.; Albert P. Youmans, Santa Clara, Calif.

[73] Assignee: Signetics Corporation, Sunnyvale, Calif.

[22] Filed: Jan. 31, 1972

[21] Appl. No.: 222,357

Related U.S. Application Data

[60] Division of Ser. No. 104,240, Jan. 6, 1971, abandoned, which is a continuation of Ser. No. 791,658, Jan. 16, 1969, abandoned.

[52] U.S. Cl. .................................... 29/578, 29/580

[51] Int. Cl. ............................................ B01j 17/00

[58] Field of Search .............. 29/578, 580, 576 TW

[56] References Cited

UNITED STATES PATENTS

| | | | |
|---|---|---|---|
| 3,486,892 | 12/1969 | Rosvold | 29/580 |
| 3,509,433 | 4/1970 | Schroeder | 317/234 |

*Primary Examiner*—W. C. Tupman

*Attorney, Agent, or Firm*—Flehr, Hohbach, Test, Albritton & Herbert

[57] ABSTRACT

Semiconductor structure and method for lowering the collector resistance in dielectrically isolated integrated circuits by providing a heavily doped layer which extends across the collector bed and to the surface of the structure.

1 Claim, 14 Drawing Figures

INVENTOR.
Hajime Mitarai
Carroll E. Nelson
BY Albert P. Youmans
Flehr, Hohbach, Test, Albritton & Herbert
Attorneys

SEMICONDUCTOR STRUCTURE AND METHOD FOR LOWERING THE COLLECTOR RESISTANCE

CROSS-REFERENCE TO RELATED APPLICATION

This application is a division of a continuation application Ser. No. 104,240 filed Jan. 6, 1971, now abandoned which is a continuation of application Ser. No. 791,658, filed on Jan. 16, 1969 now abandoned.

BACKGROUND OF THE INVENTION

Doped buried layers have heretofore been provided in integrated circuits and even in dielectrically isolated integrated circuits. However, such buried layers have only been provided in the bottoms of the islands of the dielectrically isolated circuits so that it was still necessary for collector current to flow from the emitter through the base of the transistor and down through the high resistivity collector region to the buried layer, then from the buried layer back through the high resistivity collector region to the collector contact. Since the resistivity of the collector material is chosen to provide the desired breakdown voltage for the device, it is difficult to lower the collector resistance. In the past, attempts have been made to reduce the collector resistance by diffusing a heavily doped region through the collector region down to the buried layer. However, this is generally unsatisfactory because it required a long diffusion time and also because the diffusant spread over a fairly large area. There is, therefore, a need for a new and improved structure and method for lowering the collector resistance.

SUMMARY OF THE INVENTION AND OBJECTS

The semiconductor structure comprises a support body with at least one semiconductor island carried by the support body and having a planar surface. An insulating layer is provided which isolates the semiconductor island from any other island. A transistor having base, collector and emitter regions is formed in the island. A heavily doped buried layer is provided in the island which extends across the collector region and upwardly to the surface. A lead structure which makes contact with the base, emitter and collector regions is provided. The contact element for the collector region makes contact with the heavily doped layer which extends to the surface to reduce the collector resistance.

In the method, the heavily doped buried layer can be made to extend to the surface either by forming an initial recess and heavily doping the side walls of the recess and one surface of the island before isolation moats are formed or, alternatively, by heavily doping the semiconductor island after the isolation moats have been formed by diffusing the dopant through the side walls of the isolation moats as well as the exposed surface of the semiconductor material which is to be used for forming the island.

In general, it is an object of the present invention to provide a semiconductor structure and method which can be utilized for lowering the collector resistance.

Another object of the invention is to provide a structure and method of the above character which is compatible with the fabrication of dielectrically isolated integrated circuits.

Another object of the invention is to provide a structure and method of the above character which does not require long diffusion times and utilizes only a very small area.

Additional objects and features of the invention will appear from the following description in which the preferred embodiments are set forth in detail in conjunction with the accompanying drawings.

DESCRIPTION OF THE PREFERRED EMBODIMENTS

Figure 1:
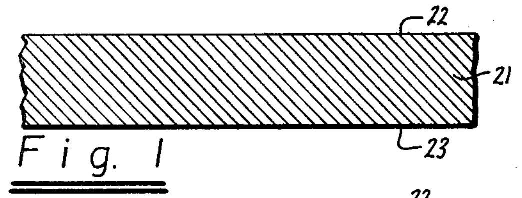
FIGS. 1 through 7 are cross-sectional views illustrating one method incorporating the present invention.
Figure 2:
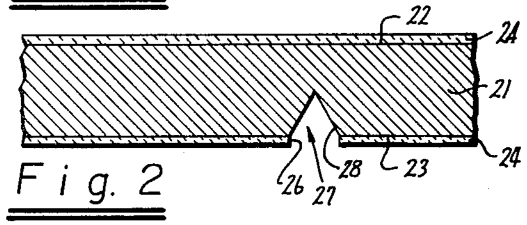
Figure 3:
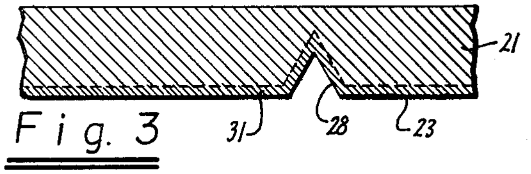
Figure 4:
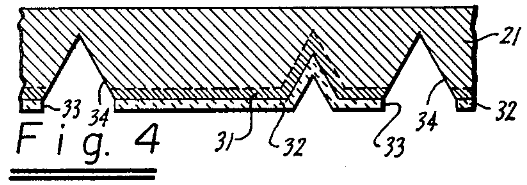

In performing the method, a semiconductor body 21 of a suitable material such as monocrystalline or single crystalline silicon is utilized. The body 21 is ground and shaped so that it is provided with two flat parallel surfaces 22 and 23. The semiconductor body 21 is then exposed to an oxidizing atmosphere to grow layers 24 of an insulating material on the surfaces 22 and 23. When the semiconductor body or wafer 21 is formed of silicon, this insulating layer takes the form of silicon dioxide which is a good insulator. A window 26 is formed in the silicon dioxide layer 24 by suitable photolithographic techniques. The semiconductor body 21 is then placed in a suitable etch such as an anisotropic etch to form a recess 27 in the semiconductor body. When an anisotropic etch is provided, the recesses formed by inclined side walls 28 join to form an apex as shown in FIG. 2.

The oxide layers 24 are then stripped and the surface 23 and the recess 27 are exposed to the dopant which is diffused into the semiconductor body to provide the heavily doped layer which is to be utilized for reducing the collector resistance. Typically, the semiconductor body 21 can have an N-type impurity therein and when this is the case, the heavily doped layer 31 which extends in from the surface 23 and in from the side walls 28 of the recess 27 can be formed by diffusing arsenic into the semiconductor body to provide a heavily doped layer 31 of the desired thickness. Typically, the arsenic would penetrate into the semiconductor wafer 21 for several microns from the surface 23 and also from the side walls 28 of the recess 27.

After the arsenic diffusion has been completed, the semiconductor body or wafer 21 is re-oxidized to form another silicon dioxide insulating layer 32 which covers the surface 23 and which also covers the side walls 28 of the recess 27. Windows 33 are then formed in the silicon dioxide layer 32 to again expose portions of the surface 23. A suitable etch such as an anisotropic etch is then utilized to form moats 34 in the semiconductor body to a depth which is normally greater than the depth of the recess 27 which will serve to isolate the islands of the semiconductor material forming the semiconductor body or wafer 21 as hereinafter described. It will be noted that the moats 34 are positioned so that the recess 27 is adjacent one side of the moat. The depth of the moats is determined by the depth of the island which is desired.

Figure 5:
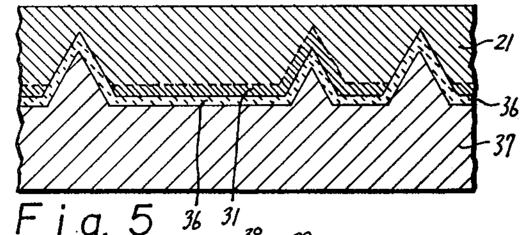
Figure 6:
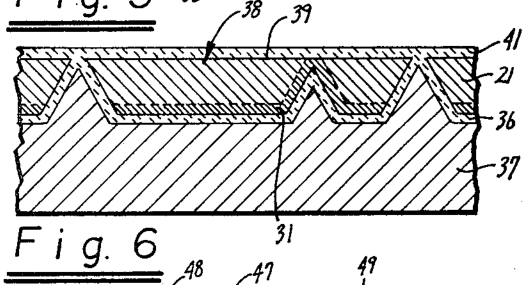

After the moats have been formed, the oxide layer 32 can be stripped and regrown so that it extends across the surface 23, into the moats 34 and into the recess 27 as shown in FIG. 5. As soon as this has been accomplished, a support body 37 is formed on the layer 36. This support body can be of any suitable type. For example, it can be formed of polycrystalline silicon which is deposited upon the silicon dioxide layer 36. The support body is to be utilized as a handle for future processing operations.

The semiconductor structure shown in FIG. 5 can then have the upper portion of the semiconductor body or wafer 21 removed in a suitable manner such as by placing the same in a lapping machine and removing material until the silicon dioxide layer 36 which has been deposited in moats 34 have been exposed. Islands 38 are also formed which are carried by the body. The islands are formed of a monocrystalline or single crystal material of the body or wafer 21 and are isolated from each other and the support body 37 by the silicon dioxide layer 36. The islands 38 are provided with exposed surfaces 39 which lie in a common plane. After the islands 38 have been formed, the semiconductor structure is placed in an oxidizing atmosphere to form a layer 41 of silicon dioxide on the surfaces 39.

Figure 7:
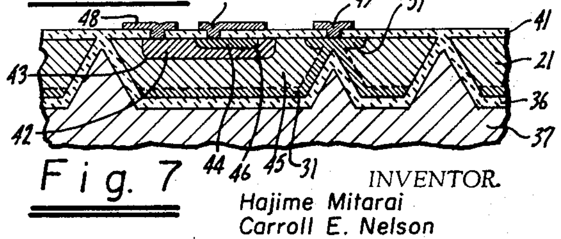

Active and passive devices can next be formed in the isolated islands 38. Thus, for example, a transistor can be formed in the island 38 as shown in FIG. 7. This is accomplished in a conventional manner by first opening a window in the oxide layer 41 and diffusing therethrough a dopant of opposite conductivity to that carried by the island to provide a base region 42 and which forms a dish-shaped PN junction 43 which extends to the surface 39. The portion of the island 38 below the base region serves as a collector region for the transistor. During the base diffusion, the oxide regrows in the windows which have been formed for the base diffusion and thereafter additional windows are provided in the oxide layer through which a dopant of the first conductivity type is diffused to provide an emitter region 44 within the base region 42 and to provide a dish-shaped PN junction 46 which extends to the surface 39. During this same time, the regions 51 are formed to make contact with the heavily doped layer 31 and to thereby make a good contact to the collector regions. During this emitter diffusion, the oxide regrows in the windows and thereafter additional windows are opened in the oxide insulating layer which overlie the base collector and emitter regions. A suitable metal such as aluminum is then evaporated over the entire surface and the undesired portions are removed to provide contact elements 47, 48 and 49 which make contact with the emitter base and collector regions respectively of the transistor formed in the island 38 shown in FIG. 7.

It will be noted that the regions 51 are positioned in such a manner that in addition to overlying the heavily doped layer 31 they extend outwardly in both directions from the heavily doped layer. Typically, the heavily doped regions 52 and the emitter can be formed by doping the structure shown with phosphorus. Region 51 is diffused at the same time as region 44 i.e., during the emitter cycle, and is of phosphorus.

Figure 8:
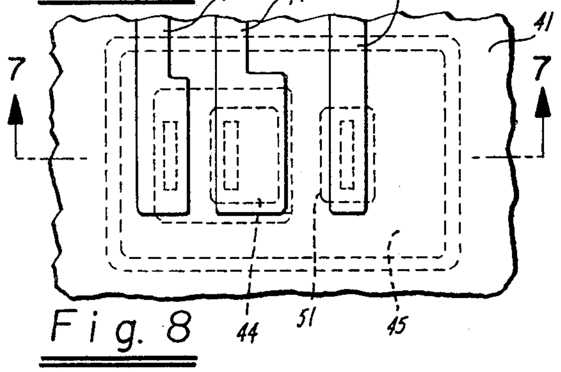
FIG. 8 is a partial plan view of the construction of the semiconductor structure shown in FIG. 7.
Figure 9:
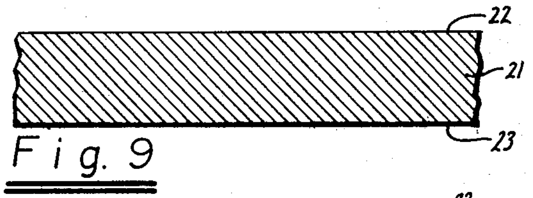
FIGS. 9 through 14 are cross-sectional views showing another embodiment of the method incorporating the present invention.
Figure 10:
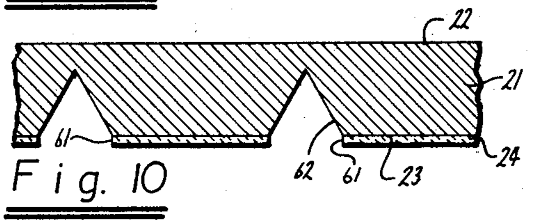

From the construction shown in FIGS. 7 and 8, it can be seen that the heavily doped layer 31 extends to the surface and makes direct contact with the heavily doped region 51 which is in direct contact with the collector contact element 49. Thus, the collector resistance is substantially reduced. It can be seen that it has been possible to accomplish this reduction in collector resistance without the utilization of any appreciable space and without the utilization of any long diffusion times.

Figure 11:
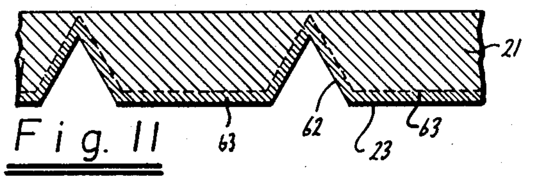
Figure 12:
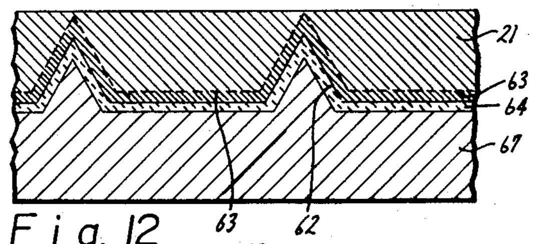
Figure 13:
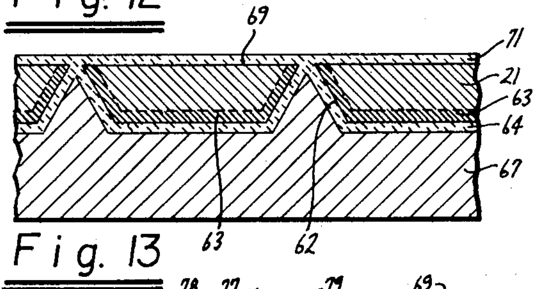
Figure 14:
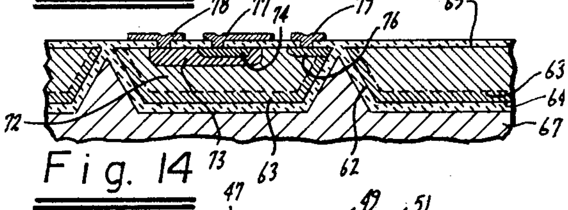

Another method for accomplishing substantially the same result is shown in FIGS. 9 through 14. The same type of semiconductor body or wafer 21 is used and an oxide coating 24 is formed on the surface 23. Windows 61 are formed in the oxide layer 24 and moats 62 are etched through the windows into the semiconductor body or wafer 21. The oxide layer is then stripped as shown in FIG. 11 and the entire surface 23 as well as the side walls of the moats 62 are subjected to the dopant which is utilized to provide a heavily doped layer 63 that extends inwardly from the surface 23 and from the side walls of the moats 62.

After the diffusion operation, the structure shown in FIG. 11 is reoxidized to provide a silicon dioxide layer 64 which covers the surface 23 and covers the side walls forming the moats 62. As soon as this has been accomplished, a support body 67 is formed on the layer 64. The support body, as hereinbefore described, can be formed of any suitable material such as polycrystalline silicon.

The upper portion of the semiconductor body 21 is removed by suitable means such as lapping to expose the silicon dioxide within the moats 62 to provide isolated islands 68 having planar surfaces 69 which lie in a common plane. As in previous embodiment, the silicon dioxide layer 64 serves to isolate each island from the other islands and also from the support body 67. A silicon dioxide layer 71 is then formed on the surfaces 69.

Active and passive devices can then be formed in the island 68 in much the same manner as hereinbefore described. Collector, base and emitter regions 72, 73 and 74 are formed with the base region being within the collector region and with the emitter region being within the base region. The heavily doped layer 63 extends across the bottom of the collector region and up the sides of the collector region to the surface 69. A heavily doped region 76 is formed by opening a window in the silicon dioxide layer 71 and diffusing the dopant therethrough during the emitter diffusion as hereinbefore described. It will be noted that the heavily doped region 76 is positioned so that one side of the same is in contact with the heavily doped layer 63 which extends through the surface and that the other portion of the same is disposed within the collector region 72 to make contact therewith. Metallization is provided in the same manner as hereinbefore described to provide collector, base and emitter contact elements 77, 78 and 79. The collector contact element makes contact with the heavily doped region 76 which is in direct contact with the heavily doped layer 63 that extends across the bottom of the collector region. Thus it can be seen that the construction shown in FIG. 14 has the same advantages as that shown in FIG. 7 and that a low collector resistance is obtained. In other words, the N+ diffusion is continuous from the top to the bottom.

It can be seen that the principal difference between the two methods is that in the first method shown in FIGS. 1 through 7, the heavily doped layer is formed before the isolation moats are etched and that the isolation moats interrupt the heavily doped layer. In the second method, the isolation moats are formed first and they are utilized for bringing the heavily doped layer to the surface.

From the foregoing, it can be seen that there has been provided a semiconductor structure and method which is particularly adaptable to dielectrically isolated circuits for greatly reducing the collector resistance. It has been possible to accomplish this without the utilization of long diffusions or by requiring any substantial additional space in the integrated circuit.

We claim:

1. In a method for making a semiconductor structure from a semiconductor body, forming a recess which is V-shaped in cross section and extending through one surface of the body by utilizing an anisotropic etch, exposing said semiconductor body to a dopant so that the dopant enters through said surface and through said recess to provide a heavily doped layer extending inwardly from the surface and along the sides of the recess, forming an isolation moat which is V-shaped in cross section also extending through said one surface after formation of said heavily doped layer by use of an anisotropic etch to a depth substantially greater than of said recess, forming a layer of insulating material on said one surface and extending into said recess and said moat, removing a substantial portion of the semiconductor body to provide an additional surface through which the heavily doped layer extends and through which the insulating layer in the moat extends, forming a layer of insulating material on said additional surface forming a semiconductor device within the body having collector, base, and emitter regions, and forming contact elements extending through said layer of insulating material on said additional surface making contact with the collector, base and emitter regions so that the contact element making contact with the collector region is in contact with the heavily doped layer extending through the additional surface.

* * * * *